April 30, 1968 J. P. STELMAK 3,381,080

HERMETICALLY SEALED SEMICONDUCTOR DEVICE

Filed July 2, 1962

WITNESSES

John E. Healy, Jr.

Raymond H. Mayerle

INVENTOR

John P. Stelmak

BY

Frederick Shapoe

ATTORNEY

United States Patent Office 3,381,080
Patented Apr. 30, 1968

3,381,080

HERMETICALLY SEALED SEMICONDUCTOR DEVICE

John P. Stelmak, Greensburg, Pa., assignor to Westinghouse Electric Corporation, East Pittsburgh, Pa., a corporation of Pennsylvania

Filed July 2, 1962, Ser. No. 206,906
5 Claims. (Cl. 174—52)

The present invention relates to a semiconductor device and, in particular, to a functional electronic element and a hermetic enclosure for the same The expanding development and use of solid state semiconductor devices and especially functional electronic element devices is accompanied by a strong need for a satisfactory miniaturized sealed package or enclosure. Heretofore, difficulties have been encountered in reducing the package size and thickness while providing a relatively good path for heat dissipation from the semiconductor element to an external heat sink; the attainment of a good hermetic seal for the semiconductor element and particularly at the junction between the walls of the enclosure and leads projecting externally; and providing suitable external lead arrangements to provide versatility and means of making interconnections and for ease of mounting the device on a supporting structure. The hermetic package referred to hereinafter may be employed to encapsulate all types of semiconductor elements, such as, for example, silicon or germanium diodes or transistors or for encapsulating a complete functional electronic element.

A functional electronic element is normally comprised of a body of semiconductor material, for example, germanium, silicon, and stoichiometric III–V and II–VI compounds. The body may be comprised of one or more active regions, such as, a diode, transistor, four-region, two or three terminal devices or combinations thereof, one or more regions functioning as a capacitance or a capacitance area disposed upon at least one surface of the body and one or more regions functioning as a resistance, either fixed or variable. The body may also contain an inductive region in addition to or in place of the resistance. The various regions and areas are connected in circuit relationship through the bulk of the body without external electrical interconnections. External electrical connections affixed to the body are limited to input, output and in some instances biasing or control leads. The body thus constituted is capable of performing a complete electronic function such as amplification, oscillation, pulse generation and the like.

Examples of such functional electronic blocks can be formed in U.S. patent applications Ser. Nos. 89,498, filed Feb. 15, 1961; 176,723, filed Mar 1, 1962; and 178,476, filed Mar 8, 1962.

The object of the present invention is to provide a hermetically sealed semiconductor device comprising a relatively thin base plate, an apertured glass plate unit joined to the base plate, metal leads heremtically sealed within and extending through the sides of the glass plate unit with portions of the leads exposed within the aperture, a semiconductor device disposed within the aperture and connected to the exposed portions of the leads, a metal frame capable of being joined to the glass plate unit extending about the periphery of the apertured glass plate and sealed thereto and a cover plate joined to the frame whereby the semiconductor device is hermetically sealed within the aperture.

A further object of the invention is to provide a thin flat hermetic enclosure embodying a semiconductor device disposed within and joined to a surface of the enclosure to enable heat to dissipate readily and leads passing through the walls of the enclosure connected to the device.

Other objects of the invention will, in part, be obvious and will, in part, appear hereinafter.

In order to more fully understand the nature and objects of the invention, reference should be had to the following detailed description and drawings, in which.

Figure 1:
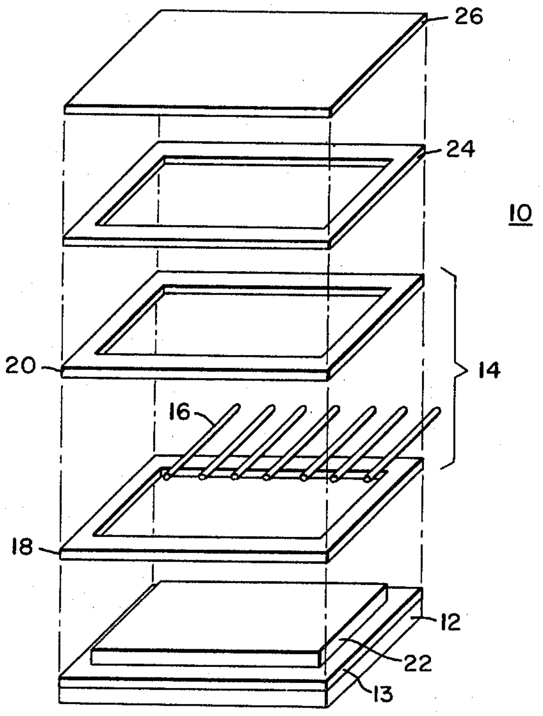
FIG. 1 is an exploded elevation view of the device of the invention.

In accordance with the present invention and in attainment of the foregoing objects, there is provided a hermetically sealed semiconductor device comprising (1) a relatively thin, substantially flat base plate, (2) an apertured glass plate unit joined to the base plate, the aperture in the glass plate unit extending completely through the plate, (3) metal leads hermetically sealed within and extending through the sides of the glass plate unit with portions of the leads exposed within the aperture, (4) at least one semiconductor element or component disposed within the aperture and connected to the exposed portions of the leads, (5) a metal frame extending about the periphery of the apertured glass plate unit and sealed thereto, and (6) a cover plate joined to the frame whereby the semiconductor device is hermetically sealed within the aperture.

The base member may comprise a ceramic or a metal, such as, alumina, beryllia, porcelain or a high silica glass or nickel-iron-chromium alloys or a nickel-cobalt-iron alloy selling under the trademark Kovar. It is particularly desirable that the base member have thermal expansion characteristics closely similar to the semiconductor member that is subsequently joined thereto. A high alumina ceramic has given good results.

The apertured glass plate unit is joined to the base plate at a suitable temperature by direct fusion, for instance, a glass-to-metal or glass-to-ceramic seal. The glass plate unit may be provided by molding a suitable glass such as lead borosilicate or lead glasses in a die at an elevated temperature above the softening point of these glasses. The base plate, apertured glass plate, metal leads, and the metal frame are placed in a fixture which holds the components in proper alignment with respect to each other and the assembly is heated above the softening temperature to form seals between the glass and the base plate, leads and frame. The resulting structure has been alternatively produced by using a solid glass plate with no aperture—wherein the aperture is formed by mechanical sand-blasting or chemical etching (using HF acids), thereby exposing the base plate and the inner portion of the leads. It is important to select the materials of the assembly so that their expansion coefficients match reasonably well over the temperature range through which the device will be employed. The semiconductor element is joined by soldering or brazing, or the like, to the upper surface of the base member within the cavity as defined by the glass plate unit. A layer of sprayed metal may be applied below the element on this base plate to facilitate soldering if the base member is comprised of a ceramic material, before joining the semiconductor element thereto. The proper components or areas of the semiconductor device are electrically connected individually to the inward ends of the electrical metal leads by small diameter wires which are bonded by thermocompression or sonowelding techniques. The relatively flat, substantially thin cover plate comprises a ceramic or metal and is joined to the frame member by brazing, soldering or the like to provide a hermetic enclosure for the semiconductor element.

Figure 2:
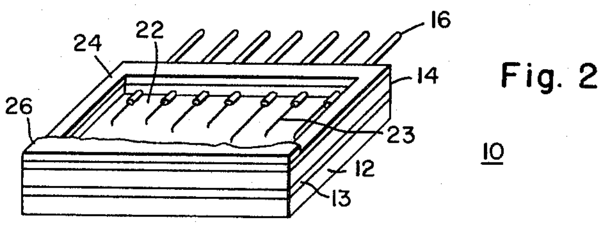
FIG. 2 is a perspective view of the device of the invention.

Referring to FIGS. 1 and 2, there is shown, respectively in perspective, the device 10 of the invention in exploded and in assembled form. The device 10 comprises a relatively thin base plate 12 to which is joined an apertured glass plate unit 14 with metal leads 16 hermetically sealed within and extending through the sides of the unit 14 with portions of the leads exposed within the aperture. The glass plate unit may comprise two relatively thin apertured glass plates 18 and 20 joined together with the electrical leads 16 sandwiched therebetween and joined thereto, or the unit may be molded as one apertured glass plate having a total thickness equal to the two glass plates 18 and 20 previously referred to with electrical leads sealed therein upon solidification. As a result each of the leads 16 is totally enclosed about a longitudinal increment by the material of the glass plate unit 14. A semiconductor device 22 is joined to the upper surface of the base plate 12 within the aperture in the glass plate unit and is connected to the electrical leads by means of electrical conductors 23. In the illustrated embodiment, the base plate 12 is shown having a layer of metallization 13 on the upper surface thereof as is desirable for mounting the semiconductor device 22 when the base plate 12 is of ceramic material. A metal frame 24 extends about the outer periphery of the glass plate unit and is joined thereto. A metallic cover plate is then joined to the metal frame 26 to provide a hermetic seal for the semiconductor device.

The following example is illustrative of the teachings of the invention.

EXAMPLE I

A device was prepared similar to that shown in FIGS. 1 and 2. The device comprised a base plate (.25″ x .25″ x .01″) comprised of a ceramic having 96% alumina having a metallized upper surface. An apertured glass plate unit (.25″ x .25″ x .02″) comprising lead borosilicate glass was fused to the base plate, the unit having a plurality of nickel-cobalt-iron alloy leads sealed therein with a portion of the leads extending into the aperture. A functional electronic element. (.125″ x .25″ x .005″) was soldered to the metallized upper surface layer on the base member within the aperture in the glass plate unit. A frame member (.25″ x .25″ x .005″) having inner dimensions similar to the dimensions of the aperture in the glass plate unit and comprising a nickel-cobalt-iron alloy selling under the trademark Kovar was fused to the outer periphery of the glass plate unit. The electrical leads were electrically connected to the functional electronic element by means of electrical conductors. A Kovar cover plate having approximately the same dimensions as the base member and having the same peripheral contour as the frame member was brazed to the frame member. The total thickness of the device was .04″. Evaluation of the completed package using helium leak detector apparatus indicated that the structure was hermetically sealed after extensive temperature cycling between the temperatures of −55° C. to 200° C.

EXAMPLE II

A device was prepared having the same size and shape as in Example I. The base plate, metal frame and cover plate was comprised of a nickel-iron-chromium alloy. The glass plate unit comprised a lead glass and the electrical leads comprised a nickel-iron alloy clad with copper. The device was tested with good results.

It should be understood that while the electrical leads are shown emerging at one end only in the drawings, they may be disposed at one or more of the four edges of the device.

While the invention has been described with reference to particular embodiments and examples, it will be understood, of course, that modifications, substitutions and the like may be made therein without departing from its scope.

I claim:

I claim as my invention:

1. In a hermetically sealed semiconductor device, a relatively thin base plate of an insulating material having a metallized surface, an apertured glass plate unit joined to said surface, the aperture in the glass plate unit extending completely through the glass plate, said glass plate enclosing an exposed portion of the surface of said base plate, metal leads hermetically sealed within and extending through the sides of the glass plate unit with portions of the leads exposed within the aperture, each lead being enclosed completely about a longitudinal increment of said lead by the material of said glass plate unit to provide electrical independence, said leads extending beyond the periphery of said base plate, a semiconductor device disposed on said base plate within the aperture and connected to the exposed portions of the leads, the base plate comprised of a material having good thermal conductivity and having thermal coefficient of expansion characteristics closely similar to that of the material of the semiconductor device, said glass plate unit extending from said base plate beyond said semiconductor device, a metal frame joined to the glass plate unit and a cover plate joined to the frame whereby the semiconductor device is hermetically sealed within the aperture.

2. A hermetically enclosed electronic device comprising: a base member of an insulator with a metallized surface; an electronic device joined to a portion of said surface of said base member, a glass member joined to said surface and defining a wall enclosing said portion of said surface to which said electronic device is joined; said glass member extending from said surface beyond said electronic device; a plurality of electrically conductive leads hermetically sealed within said glass member extending beyond the periphery of said base member and being substantially parallel with said surface of said base member, said electrical leads being connected to said electronic device; means joined to said glass member at a position beyond said electronic device with respect to said base member to form a hermetic enclosure with said glass member and said base member; each of said electrical leads being totally enclosed about a longitudinal increment thereof by the material of said glass member to provide electrical independence of each lead from said base member and said means joined to said glass member.

3. A hermetic enclosure as in claim 2 wherein: said base member is a ceramic member and said surface of said base member is metallized; said glass member is joined directly to said surface; and said means joined to said glass member comprises a flat metal frame joined directly to said glass member and a flat metal cover plate joined to said metal frame.

4. A hermetic enclosure as in claim 3 wherein: said ceramic member is of a high alumina ceramic material; said glass member is a member of the group consisting of lead borosilicate glass and lead glass and said leads, said metal frame and said metal coverplate are of nickel-cobalt-iron alloy.

5. A hermetically enclosed electronic device comprising: a relatively thin flat base plate of ceramic material having a metallized surface; a solid state electronic device poined to said metallized surface; a glass wall member fused directly to said surface and surrounding said electronic device, said glass wall member extending substantially perpendicularly from said surface to a position beyond said electronic device; a plurality of electrically conductive leads hermetically sealed within said glass wall member extending substantially parallel to said surface and having a first extremity joined to said electronic device and a second extremity beyond the periphery of said base member; a flat metal frame fused directly to the surface of said glass wall member remote from said base member, said metal frame having a configuration like that of said glass wall member; a metal cover plate joined to said metal frame and covering said eletronic device; each of said electrical leads being totally enclosed about a longitudinal increment thereof by the material of said glass member to provide electrical independence of each lead from said base plate, said metal frame and said metal cover plate.

References Cited

UNITED STATES PATENTS

| | | | |
|---|---|---|---|
| 2,994,121 | 8/1961 | Shockley. | |
| 3,141,999 | 7/1964 | Schneider. | |
| 2,177,502 | 10/1939 | Stack | 174—65 X |
| 2,876,401 | 3/1959 | Fuller | 317—235 |
| 2,985,806 | 4/1961 | McMahon et al. | 317—235 |
| 3,110,080 | 11/1963 | Boyer et al. | |
| 2,795,746 | 6/1957 | Lange | 317—234 X |
| 2,799,814 | 7/1957 | Schwartz | 317—234 X |
| 2,999,964 | 9/1961 | Glickman | 317—234 |
| 3,001,110 | 9/1961 | Frazier | 317—234 |

DARRELL L. CLAY, *Primary Examiner.*

JAMES D. KALLAM, JOHN F. BURNS, *Examiners.*

W. B. FREDERICKS, C. E. PUGH, *Assistant Examiners.*